United States Patent
Tian

(10) Patent No.: US 10,600,976 B2
(45) Date of Patent: Mar. 24, 2020

(54) THIN FILM TRANSISTOR SENSOR AND MANUFACTURING METHOD THEREOF

(71) Applicant: BOE Technology Group Co., Ltd., Beijing (CN)

(72) Inventor: Xueyan Tian, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/527,823

(22) PCT Filed: Jun. 16, 2016

(86) PCT No.: PCT/CN2016/085956
§ 371 (c)(1),
(2) Date: May 18, 2017

(87) PCT Pub. No.: WO2017/133157
PCT Pub. Date: Aug. 10, 2017

(65) Prior Publication Data
US 2018/0114931 A1    Apr. 26, 2018

(30) Foreign Application Priority Data

Feb. 4, 2016   (CN) .......................... 2016 1 0079996

(51) Int. Cl.
*H01L 29/786*   (2006.01)
*H01L 51/05*   (2006.01)
(Continued)

(52) U.S. Cl.
CPC ............ *H01L 51/0545* (2013.01); *G01L 1/16* (2013.01); *H01L 51/0021* (2013.01);
(Continued)

(58) Field of Classification Search
CPC ............. H01L 51/0545; H01L 51/0097; H01L 51/0021; G01L 1/16
See application file for complete search history.

(56) References Cited

U.S. PATENT DOCUMENTS 4,894,698 A * 1/1990 Hijikigawa ........... G01L 9/0098
257/254
2002/0011986 A1   1/2002 Hasegawa et al.
(Continued)

FOREIGN PATENT DOCUMENTS

CN   1262530 A    8/2000
CN   101625617 A  1/2010
(Continued)

OTHER PUBLICATIONS

May 20, 2016—(WO) International Search Report and Written Opinion Appn PCT/CN2016/085956 with English Tran.
(Continued)

*Primary Examiner* — Cuong B Nguyen
*Assistant Examiner* — Samuel Park
(74) *Attorney, Agent, or Firm* — Banner & Witcoff, Ltd.

(57) ABSTRACT

Provided are a thin film transistor sensor and a manufacturing method thereof. The thin film transistor sensor includes a first substrate and a second substrate opposite to each other, the first substrate includes a first flexible base substrate and a first gate electrode disposed on the first flexible base substrate, and the second substrate includes a second flexible base substrate and a second gate electrode disposed on the second flexible base substrate; the second gate electrode is at least partially overlapped with and separated from the first gate electrode, and configured to be electrically connected to the first gate electrode after the thin film transistor sensor is applied with a voltage, such that the thin film transistor sensor is turned on.

20 Claims, 4 Drawing Sheets

(51) Int. Cl.
  *H01L 51/10* (2006.01)
  *G01L 1/16* (2006.01)
  *H01L 51/00* (2006.01)

(52) U.S. Cl.
  CPC ...... *H01L 51/0097* (2013.01); *H01L 51/0554* (2013.01); *H01L 51/10* (2013.01); *H01L 51/107* (2013.01); *Y02E 10/549* (2013.01)

(56) References Cited

U.S. PATENT DOCUMENTS

| | | | | |
|---|---|---|---|---|
| 2002/0145188 | A1* | 10/2002 | Kodama | H01L 23/051 257/678 |
| 2004/0174097 | A1 | 9/2004 | Hasegawa et al. | |
| 2006/0098059 | A1* | 5/2006 | Ohguro | B81B 3/0018 347/72 |
| 2008/0290407 | A1* | 11/2008 | Kusunoki | H01L 27/0611 257/334 |
| 2009/0032810 | A1* | 2/2009 | Aoki | H01L 27/283 257/40 |
| 2010/0007624 | A1 | 1/2010 | Jiang et al. | |
| 2010/0079398 | A1 | 4/2010 | Shen et al. | |
| 2010/0090299 | A1* | 4/2010 | Chang | G01L 1/205 257/419 |
| 2011/0235156 | A1 | 9/2011 | Kothari et al. | |
| 2015/0029684 | A1* | 1/2015 | Park | H01L 27/1262 361/749 |

FOREIGN PATENT DOCUMENTS

| | | |
|---|---|---|
| CN | 101685212 A | 3/2010 |
| CN | 101894855 A | 11/2010 |
| CN | 105552132 A | 5/2016 |
| JP | 2011028785 A | 2/2011 |

OTHER PUBLICATIONS

Dec. 28, 2017—(CN) First Office Action Appn 201610079996.9 with English Tran.

Aug. 16, 2019—(EP) Extended European Search Report Appn No. 16863200.8.

Demelas, et al., "Charge Sensing by Organic Charge-Modulated Field Effect Transistors: Application to the Detection of Bio-Related Effects", Journal of Materials Chemistry B, vol. 1, No. 31, Jan. 1, 2013, pp. 3811-3819.

Elkington, et al.,"Organic Thin-Film Transistor (OTFT)-Based Sensors", Electronics, vol. 3, No. 4, Apr. 8, 2014, pp. 234-254.

* cited by examiner

US 10,600,976 B2

THIN FILM TRANSISTOR SENSOR AND MANUFACTURING METHOD THEREOF

The application is a U.S. National Phase Entry of International Application No. PCT/CN2016/085956 filed on Jun. 16, 2016, designating the United States of America and claiming priority to Chinese Patent Application No. 201610079996.9 filed on Feb. 4, 2016. The present application claims priority to and the benefit of the above-identified applications and the above-identified applications are incorporated by reference herein in their entirety.

TECHNICAL FIELD

At least one of embodiments of the present disclosure relates to a thin film transistor sensor and a manufacturing method thereof.

BACKGROUND

In recent years, with rapid development of in-vitro medical equipment and in-vivo implanting medical equipment related to a human body, pressure sensors gain more and more attention. By disposing the pressure sensors, the change of an external pressure signal can be sensed.

SUMMARY

At least one of embodiments of the present disclosure relates to a thin film transistor sensor and a manufacturing method thereof. The thin film transistor sensor realizes a spatial ON/OFF function of the thin film transistor by using a spatial point contact change of the first gate electrode and the second gate electrode of the flexible thin film transistor, so as to realize functions of the sensor.

At least one of embodiments of the present disclosure provides a thin film transistor sensor, comprising a first substrate and a second substrate opposite to each other. The first substrate includes a first flexible base substrate and a first gate electrode on the first flexible base substrate; the second substrate includes a second flexible base substrate and a second gate electrode on the second flexible base substrate; the first flexible base substrate further includes an active layer, a source electrode and a drain electrode; the second gate electrode and the first gate electrode at least partially overlap and are separated from each other, and configured to be electrically connected after the thin film transistor sensor is applied with a voltage, to allow the thin film transistor sensor to be turned on.

At least one of embodiments of the present disclosure provides a manufacturing method for a thin film transistor sensor, comprising: forming a first gate electrode on a first flexible base substrate to prepare a first substrate; forming a second gate electrode on a second flexible base substrate to prepare a second substrate; forming an active layer, a source electrode and a drain electrode on the first flexible base substrate; and disposing the first substrate and the second substrate to face each other, to allow the second gate electrode and the first gate electrode to at least partially overlap and to be separated, and configured to be electrically connected to each other after the thin film transistor sensor is applied with a voltage, so as to allow the thin film transistor sensor to be turned on.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

REFERENCE SIGNS

Figure 1:
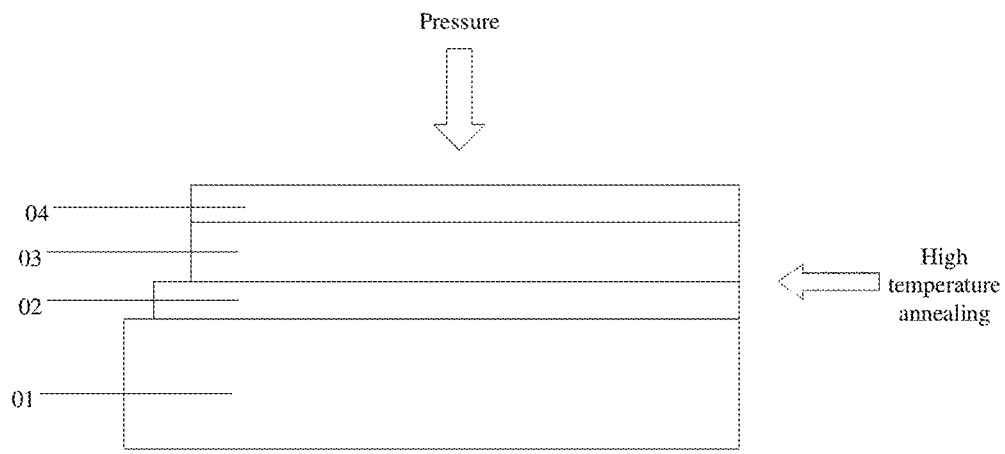
FIG. 1 is a schematic diagram of a basic structure of a common piezoelectric thin film sensor.

01—silicon substrate; 02—lower electrode; 03—piezoelectric thin film; 04—upper electrode; 10—first substrate; 12—thin film transistor sensor; 20—second substrate; 30—spacer; 40—pressure conductive material; 101—first flexible base substrate; 102—first gate electrode; 103—active layer (semiconductor layer); 104—source electrode; 105—drain electrode; 106—flexible gate electrode insulating layer; 201—second flexible base substrate; 202—second gate electrode; 301—sub-spacer; 107—first thickening layer; 203—second thickening layer; 222—airtight space.

DETAILED DESCRIPTION

In order to make objects, technical details and advantages of the embodiments of the present disclosure apparent, the technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, a person of ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Based on many working principles, pressure sensors can be divided into a capacitive type, a piezoresistive type, a piezoelectric type, or the like, and a common piezoelectric thin film sensor works based on the piezoelectric effect mainly. The piezoelectric effect refers to, for example, when some dielectric is deformed due to an action of an external force along a certain direction, a polarizing phenomenon is generated therein, meanwhile, positive and negative charges are emerged on two opposite surfaces of the dielectric; When the external force is removed, it is restored to an uncharged state, and this phenomenon is called as direct piezoelectric effect. One type of sensors researched and manufactured according to the dielectric piezoelectric effect is called as piezoelectric sensors. It is difficult for the basic structure, process and performances of a normal pressure sensor to achieve biologic compatibility required by a human body because of no flexibility and elasticity. It is also difficult for a sensor to match with human body-related medical in-vitro and wearable devices in a humanized manner. The feasibility of in-vivo implantation medical treatment is even more harder to be realized.

The basic structure of a piezoelectric thin film sensor is of a three-layer structure formed by a piezoelectric film sandwiched between conductive films as an upper electrode and a lower electrode. As shown in FIG. 1, a lower electrode 02, a piezoelectric thin film 03 and an upper electrode 04 are disposed on a silicon substrate 01 in sequence. A material of the lower electrode 02 and the upper electrode 04 can include at least one of Au, Ag, Pt, or Ti, for example, and the piezoelectric thin film 03 can include at least one of PCT, BZT, for example. In a common method, a thin film related to the sensor elements is prepared on the silicon substrate 01. When the piezoelectric thin film layer is prepared by a silicon chip, an annealing process of 600-700° C. is generally adopted, and the rest related integrated circuits can be prepared by semiconductor processes. It is difficult for the basic structure, process and performances of a normal pressure sensor to achieve biologic compatibility required by a human body because of no flexibility and elasticity. It is very difficult for the sensor to match with human body-related medical in-vitro and wearable devices in a humanized manner. The feasibility of in-vivo implantation medical treatment is even more harder to be realized.

An Active Thin Film Transistor is considered as an ideal choice for realizing signal transmission and control of a flexible pressure sensor, the flexible pressure sensor is favorable for reducing power consumption of the devices in one hand and can effectively reduce crosstalk between sensitive signals in a sensor array in the other hand. The flexible pressure sensor can be applied to construction of an artificial electronic skin potentially, and has a very broad market prospect in the field of future healthy medical treatment. In addition, the flexible pressure sensor is also a core element and device in display of a flexible touch screen and application of an intelligent robot, which all indicate potential application values of the flexible pressure sensor.

How to select a proper flexible active thin film transistor to realize effective integration of a flexible pressure sensitive unit and the active thin film transistor as well as how to realize active output and control of the flexible pressure sensor will become an important direction in research of the flexible pressure sensor.

Embodiments of the present disclosure start using a new piezoelectric sensitive principle and design, such that the pressure sensor achieves excellent sensing effects.

At least one embodiment of the present disclosure provides a thin film transistor sensor, comprising a first substrate and a second substrate opposite to each other. The first substrate includes a first flexible base substrate and a first gate electrode disposed on the first flexible base substrate, and the second substrate includes a second flexible base substrate and a second gate electrode disposed on the second flexible base substrate. The second gate electrode and the first gate electrode at least partially face each other (at least partially overlap), and are insulated from each other when the thin film transistor sensor is not in a work state. The first flexible base substrate is also provided with an active layer, a source electrode and a drain electrode. For example, the second gate electrode and the first gate electrode at least partially face each other and are separated, and are configured to be electrically connected after the thin film transistor sensor is applied with a voltage, such that the thin film transistor sensor is turned on.

The thin film transistor sensor realizes an ON/OFF function of the thin film transistor by using a spatial point contact change of the first gate electrode and the second gate electrode of the flexible thin film transistor, so as to realize functions of the sensor. The thin film transistor sensor is controlled by applied an external pressure, such that conversion from the change of an external weak pressure to the sensitive change of an electric signal is realized.

At least one embodiment of the present disclosure provides a manufacturing method for a thin film transistor sensor, and the method comprises following steps.

Forming a first gate electrode on a first flexible base substrate to prepare a first substrate;

Forming a second gate electrode on a second flexible base substrate to prepare a second substrate;

Forming an active layer, and a source electrode and a drain electrode which are electrically connected to the active layer on the first flexible base substrate;

Disposing the first substrate and the second substrate oppositely, such that the second gate electrode and the first gate electrode at least partially face each other, and are insulated from each other when the thin film transistor sensor is not in a work state. For example, the second gate electrode and the first gate electrode at least partially face each other (at least partially overlap), are separated and configured to be electrically connected after the thin film transistor sensor is applied with a voltage, so that the thin film transistor sensor is turned on.

The manufacturing method for a thin film transistor sensor can adopt a process which is simple and feasible and low in manufacturing and maintenance cost.

Explanation is carried out by several embodiments below.

Embodiment I

Figure 2:
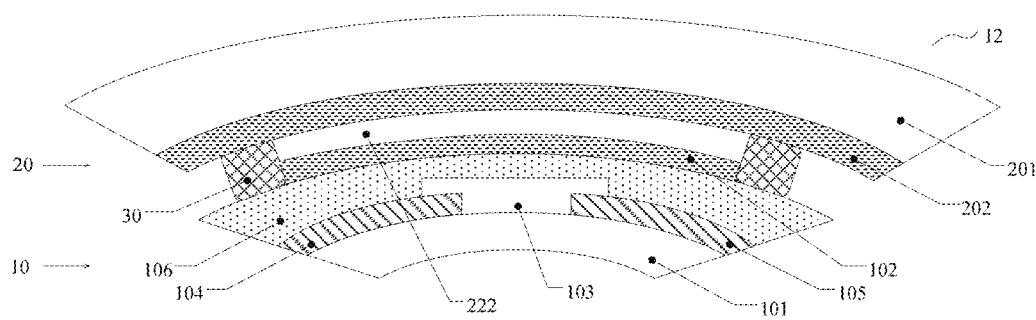
FIG. 2 is a structural schematic diagram (sectional view) of a thin film transistor sensor provided by an embodiment of the present disclosure.

The present embodiment provides a thin film transistor sensor 12, as shown in FIG. 2, comprising a first substrate 10 and a second substrate 20 opposite to each other. The first substrate 10 includes a first flexible base substrate 101 and a first gate electrode 102 disposed on an inner side of the first flexible base substrate 101. The second substrate 20 includes a second flexible base substrate 201 and a second gate electrode 202 disposed on an inner side of the second flexible base substrate 201. The second gate electrode 202 and the first gate electrode 102 at least partially face each other (at least partially overlap), and are insulated from each other when the thin film transistor sensor 12 is not in a work state. The first flexible base substrate 101 is further provided with an active layer 103 facing the first gate electrode, and a source electrode 104 and a drain electrode 105 electrically connected to the active layer 103. For example, the second gate electrode and the first gate electrode at least partially face each other, are separated and configured to be electrically connected after the thin film transistor sensor is applied with a voltage, such that the thin film transistor sensor is turned on. For example, "the second gate electrode 202 and the first gate electrode 102 at least partially face each other (at least partially overlap)" refers to that parts of them face (overlap with) each other in a direction perpendicular to the first flexible base substrate 101; or an orthogonal projection of the second gate electrode 202 on the first flexible base substrate 101 and an orthogonal projection of the first gate electrode 102 on the first flexible base substrate 101 at least partially overlap.

The second gate electrode 202 and the first gate electrode 102 at least partially face each other such that the second gate electrode 202 and the first gate electrode 102 can be electrically connected, such as making a contact to be ON, when the thin film transistor sensor 12 is applied with a voltage, but embodiments are not limited thereto. For example, the source electrode 104 and the drain electrode 105 can be disposed on two sides of the active layer 103 respectively and are connected to the active layer 103 respectively. The thin film transistor includes a gate electrode, a gate electrode insulating layer, an active layer, a source electrode and a drain electrode. In the embodiment of the present disclosure, the "insulated from each other" for example refers to non-electric connection; the "flexible" for example refers to bendable; the "work state" for example refers to an ON state of the thin film transistor, and the "non-work state" for example refers to an unopened (OFF) state of the thin film transistor. The thin film transistor sensor realizes an ON/OFF function of the thin film transistor by using a spatial point contact change of the first gate electrode and the second gate electrode of the flexible thin film transistor, so as to realize functions of the sensor. The thin film transistor sensor is controlled by applying an external pressure, such that conversion from the change of an external weak pressure to the sensitive change of an electric signal is realized.

For example, as shown in FIG. 2, a source electrode 104, a drain electrode 105 and an active layer 103 can be disposed on the inner side of the first flexible base substrate 101; or the source electrode 104, the drain electrode 105 and the active layer 103 can be disposed on the outer side of the first flexible base substrate 101, but the embodiments of the present disclosure are not limited thereto. In the embodiment of the present disclosure, the "inner side" for example refers to a side of the first substrate 10 facing the second substrate 20, or a side of the second substrate 20 facing the first substrate 10, and the "outer side" for example refers to a side of the first substrate 10 departed from (away from) the second substrate 20, or a side of the second substrate 20 departed from (away from) the first substrate 10. It is noted that locations of the source electrode 104, the drain electrode 105 and the active layer 103 are not limited to those shown in the drawings. For example, the active layer 103 can be formed at first, then the source electrode 104 and the drain electrode 105 can be formed, but the embodiments of the present disclosure are not limited thereto.

Figure 3A:
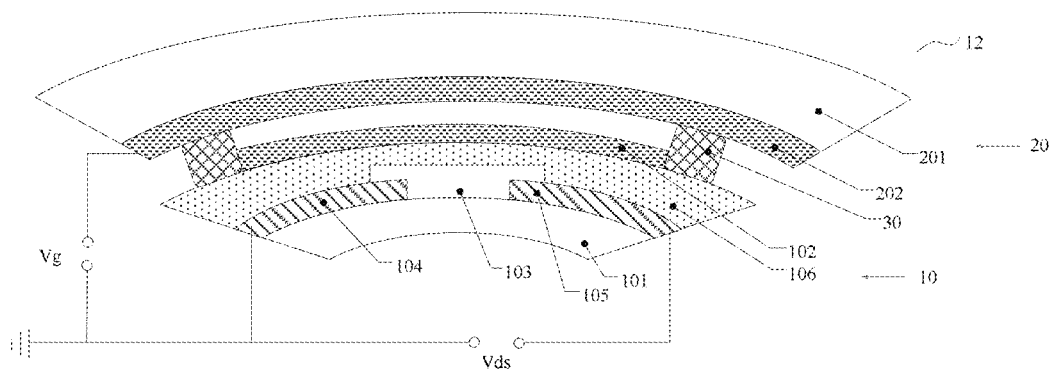
FIG. 3a is a working schematic diagram (before a voltage is applied) of a thin film transistor sensor provided by an embodiment of the present disclosure.
Figure 3B:
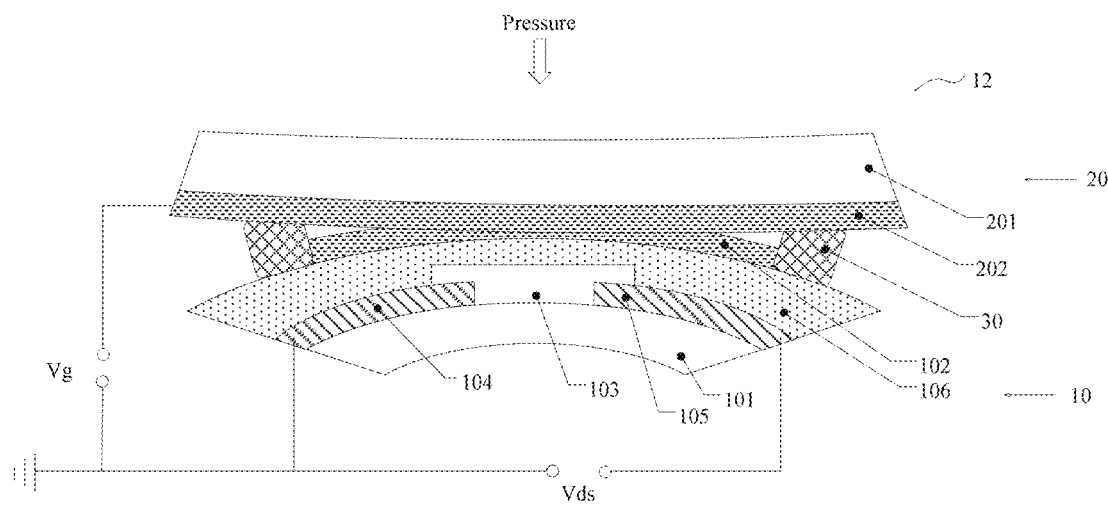
FIG. 3b is a working schematic diagram (after a voltage is applied) of a thin film transistor sensor provided by an embodiment of the present disclosure.
Figure 4:
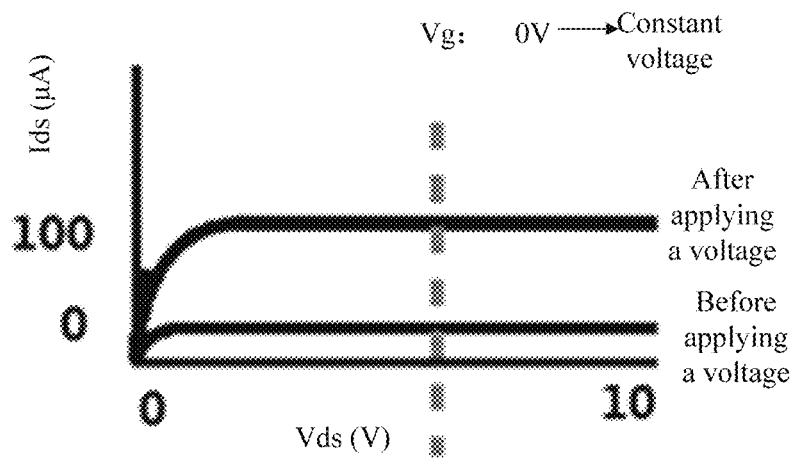
FIG. 4 is a schematic diagram of a current-voltage relationship between a source electrode and a drain electrode of a thin film transistor sensor before and after a voltage is applied provided by an embodiment of the present disclosure.

For example, the second gate electrode 202 is electrically connected to a gate line, which is configured to provide a gate electrode signal for the thin film transistor. As shown in FIG. 3a, a voltage of the second gate electrode is Vg, a voltage difference between the drain electrode and the source electrode is Vds, a current between the drain electrode and the source electrode is Ids. Before the thin film transistor sensor is applied with a voltage, the first gate electrode 102 and the second gate electrode 202 are insulated from each other and are in a non-electric connection state, and the thin film transistor is in an OFF state. For example, the first gate electrode 102 and the second gate electrode 202 do not contact each other, and a first gate electrode voltage of the thin film transistor is 0V. After a voltage is applied, as shown in FIG. 3b, the first gate electrode 102 and the second gate electrode 202 are electrically connected, for example, first gate electrode 102 and the second gate electrode 202 contact each other, a gate electrode signal is conducted to the first gate electrode 102 by the second gate electrode 202, the first gate electrode voltage of the thin film transistor is equal to the second gate electrode voltage, for example, both are a constant voltage, and the thin film transistor can be switched on. As shown in FIG. 4, before a voltage is applied, Ids=0V, barely no current flows between the source electrode and the drain electrode, after a voltage is applied, the source electrode and the drain electrode are ON, and a current flows therebetween. In this way, a pressure signal can be sensed and the sensed pressure signal can be transmitted. After the pressure is removed, the second gate electrode 202 is separated from the first gate electrode 102 under the action of an elastic action force and/or restoring force, restoring the state without a voltage, and the state that the first gate electrode 102 and the second gate electrode 202 are insulated from each other is restored.

For example, a material of the first flexible base substrate and/or the second flexible base substrate can be polydimethylsiloxane (PDMS), polyimide (PI), polyethylene naphthalate, poly-p-xylylene or poly(methyl methacrylate) (PMMA), but the present embodiments are not limited thereto. For example, a material of the active layer 103 includes semi-conductive carbon nanotubes (for example, Single-Walled Carbon Nanotubes (SWCNTs), or Multi-Walled Carbon Nanotubes (MWCNTs)), or an organic semiconductor material, but the present embodiments are not limited thereto. For example, a material of the source electrode 104 and the drain electrode 105 includes metallic carbon nanotubes (for example, SWCNTs, or MWCNTs, or the like), or metal, but the present embodiments are not limited thereto.

It is noted that Carbon Nanotubes (CNTs) have excellent flexibility and very excellent photoelectric property. The CNT material is very outstanding among biological nanometer materials due to the higher stability and better biocompatibility. The CNTs can serve as a basic material for preparing a cell growth stent, an artificial blood vessel, a medicine carrier, or the like of tissue engineering. In an embodiment of the present disclosure, for example, the SWCNTs are adopted, or for example, the MWCNTs are adopted, etc., and the CNTs can be metallic or semi-conductive according to structural parameters, a preparing process, or the like. An application prospect of the CNTs in the medical field and other fields is highly expected.

For example, in a thin film transistor sensor provided by an example of the present embodiment, a material of the first gate electrode 102 and the second gate electrode 202 includes metal, or carbon black. In aninstance that the material of the first gate electrode 102 is metal, for example, it can include one or more of palladium (Pd), titanium, tantalum, chromium, aluminum, aluminum alloy, copper, copper alloy, molybdenum and molybdenum aluminum alloy, but the present embodiments are not limited thereto. It is noted that there is a popular belief that Pd is a metal element with better biocompatibility, and it can serve as a better material of the first gate electrode 102 and the second gate electrode 202.

Figure 5A:
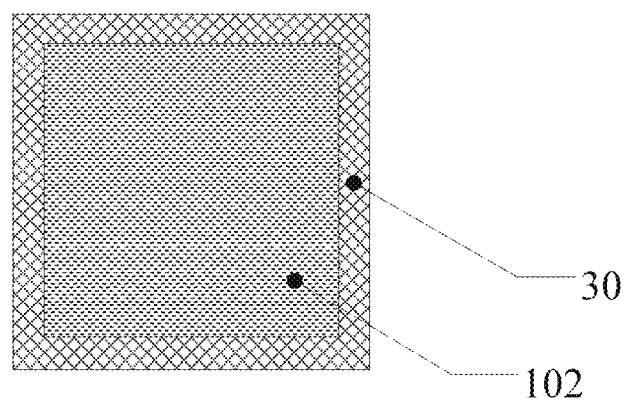
FIG. 5a is a top schematic diagram of a spacer in a thin film transistor sensor provided by an embodiment of the present disclosure.
Figure 5B:
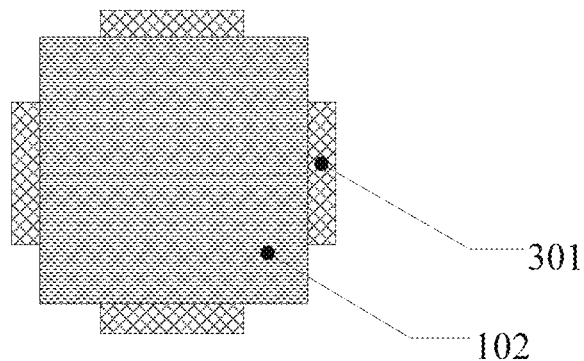
FIG. 5b is a top schematic diagram of another spacer in a thin film transistor sensor provided by an embodiment of the present disclosure.

For example, the thin film transistor sensor provided by an example of the present embodiment further comprises a spacer 30 disposed between the first substrate 10 and the second substrate 20, so as to separate the first gate electrode 102 from the second gate electrode 202. For example, as shown in FIGS. 2 and 5a, the spacer 30 is disposed around the edge of the first gate electrode 102, the first substrate 10, the second substrate 20 and the spacer 30 can form an airtight space 222, and air, nitrogen gas, or inert gas exists in the airtight space. For example, as shown in FIG. 5b, the spacer 30 can include a plurality of dispersed sub-spacers 301, and FIG. 5b shows four sub-spacers 301 around the first gate electrode 102, but the present embodiments are not limited thereto. When the first gate electrode 102 and the spacer 30 are as shown in FIG. 5b, the first substrate 10, the second substrate 20 and the spacer 30 do not form an airtight space. That is, the first substrate 10, the second substrate 20 and the spacer 30 can form an airtight space, or non-airtight space, which is not limited in the embodiment of the present disclosure. It is noted that the spacer 30 is not limited to the ones in the drawing, and the shape of the first gate electrode 102 is not limited to the shapes as shown in FIGS. 5a and 5b, either. For example, a material of the spacer 30 includes PMMA, PI, or PDMS, but the present embodiments are not limited thereto. For example, the spacer 30 can be an elastic spacer, including an elastic separating column, or elastic separating ball. The "elastic" refers to stretchable or compressible.

It is noted that polydimethylsiloxane (PDMS) is a novel polymer material, is elastic and transparent gommures, and is safe and nontoxic. The poly(methyl methacrylate) (PMMA) is a photoresist polymer material. The thickness of crosslinking PMMA as a function of an exposure electron beam dose can be conveniently adjusted, such that 2D electron beam photolithography can obtain a 3D PMMA sacrificial layer. The PMMA has excellent charge storage capacity, and can also be used as a dielectric in devices. A PMMA polymer thin film is same as PDMS in softness. Both the PDMS and PMMA can serve as a better material of the spacer 30.

For example, in the thin film transistor sensor provided by an example of the present embodiment, a source electrode 104, a drain electrode 105 and an active layer 103 are disposed on the inner side of the first flexible base substrate 101, a flexible gate electrode insulating layer 106 is disposed between the first gate electrode 102 and the source electrode 104, and the drain electrode 105 and the active layer 103; and the flexible gate electrode insulating layer 106 and the spacer 30 are integrally formed. In this arranging way, the flexible gate electrode insulating layer 106 and the spacer 30 can be formed at a single step, and a process is saved. For example, a material of the flexible gate electrode insulating layer 106 can include PMMA, but the present embodiments are not limited thereto.

Figure 6A:
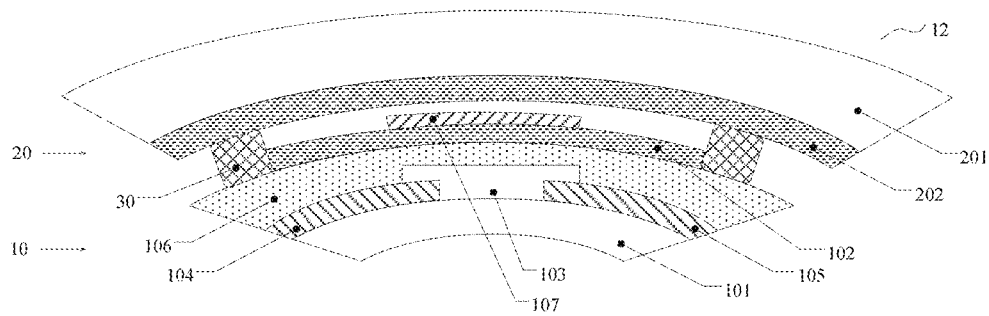
FIG. 6a is a sectional view of another thin film transistor sensor provided by an embodiment of the present disclosure.
Figure 6B:
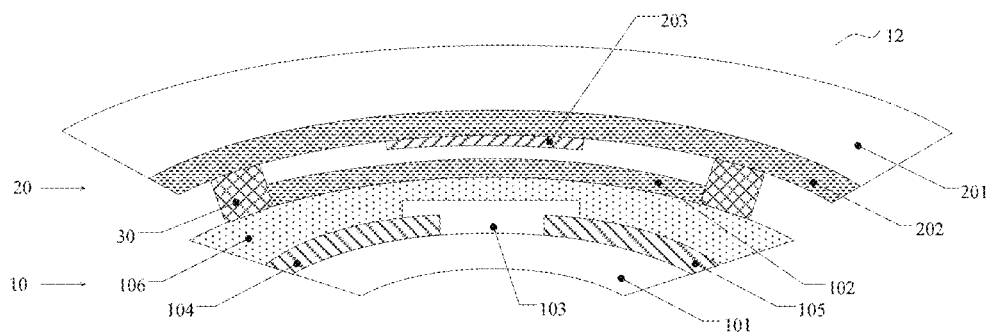
FIG. 6b is a sectional view of another thin film transistor sensor provided by an embodiment of the present disclosure.

For example, in the thin film transistor sensor provided by an example of the present embodiment, as shown in FIG. 6a, a first thickening layer 107 is disposed on a side of the first gate electrode 102 facing the second gate electrode 202, or, as shown in FIG. 6b, a second thickening layer 203 is disposed on a side of the second gate electrode 202 facing the first gate electrode 102, or the first thickening layer 107 is disposed on a side of the first gate electrode 102 facing the second gate electrode 202 and the second thickening layer 203 is disposed on a side of the second gate electrode 202 facing the first gate electrode 102. A thickness of the first thickening layer 107, a thickness of the second thickening layer 203, or a sum of the thickness of the first thickening layer 107 and that of the second thickening layer 203, is smaller than a distance between the first gate electrode 102 and the second gate electrode 202. The first thickening layer 107 and/or the second thickening layer 203 can further improve the sensitivity of the thin film transistor sensor to a pressure to allow the pressure to be easier to sense. For example, the first thickening layer 107 and the first gate electrode 102 can be formed integrally, and/or the second thickening layer 203 and the second gate electrode 202 can be integrally formed. In this disposing manner, the manufacturing process can be simplified.

For example, in the thin film transistor sensor provided by an example of the present embodiment, materials of the first flexible base substrate and second flexible base substrate are both PDMS, a material of the active layer 103 is semi-conductor SWCNTs; a material of the source electrode 104 and the drain electrode 105 is metallic SWCNTs, or Pd; materials of the first gate electrode 102 and the second gate electrode 202 are both Pd, the flexible gate electrode insulating layer 106 and the spacer 30 are integrally formed; and materials of the flexible gate electrode insulating layer 106 and the spacer 30 are both PMMA. The thin film transistor sensor provided by the example adopts the flexible base substrates and has the elastic flexible gate electrode insulating layer, and the active layer, the source electrode and the drain electrode are all elastic. In this way, an elastic flexible sensor compatible with a human body can be obtained (for example, a full-elastic flexible thin film transistor can be obtained) and an excellent sensing effect is realized. The elastic flexible sensor as a flexible dynamic strain sensor is suitable for the fields of medical treatment and wearable devices, and used for monitoring and therapy of in-vitro medical treatment, or medical treatment of implantation into the human body.

For example, in the thin film transistor sensor provided by an example of the present embodiment, thicknesses of the first flexible base substrate and the second flexible base substrate are larger than 1 μm, for example, it can be 2 μm. The thicknesses of the source electrode 104 and the drain electrode 105 are larger than 50 nm. The thickness of the active layer 103 is smaller than 10 nm. The thicknesses of the first gate electrode 102 and the second gate electrode 202 are about 40-100 nm, for example, it can be 70 nm. The thickness of the flexible gate electrode insulating layer 106 is smaller than 100 nm. The height of the spacer 30 can be 0.05-0.1 mm. The distance between the first gate electrode 102 and the second gate electrode 202 is about 0.07-0.1 mm A part of the active layer between the source electrode and the drain electrode is a channel which has a length about 50-100 μm. It is noted that the values above are merely examples rather than limitation, and other values may also be adopted.

For example, the thin film transistor sensor provided by an example of the present embodiment has a suitable test pressure range of being smaller than 0.5K Pa, but the present embodiments are not limited thereto.

Embodiments further provide a thin film transistor sensor array, including any of the described thin film transistor sensors.

The thin film transistor sensor element and the array thereof provided by the present embodiments not only have sensitivity but also transmit a pressure received by the elastic thin film transistor element to the outside, then signal is obtained in the outside to make a reaction.

The thin film transistor sensor element and the array thereof provided by the present embodiments can have characteristics of flexibility and super sensitivity, sense a touch control (external pressure) and transmit the sensed touch control (external pressure) signal. They are expected to be applied in the fields of artificial electronic skin, artificial limbs, robots, medical safety and medical instruments.

Embodiment II

Figure 7:
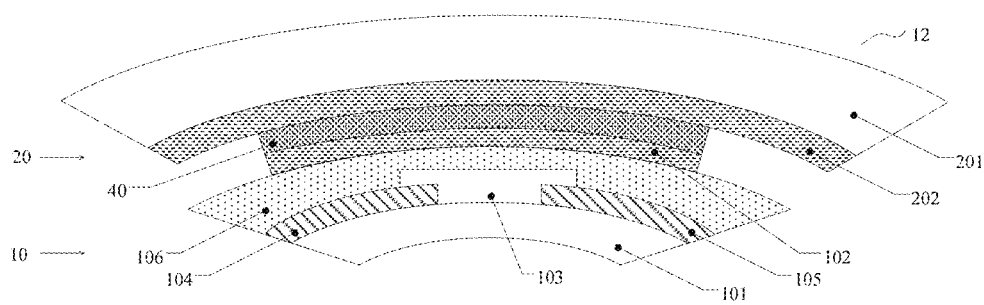
FIG. 7 is a sectional view of a thin film transistor sensor provided by another embodiment of the present disclosure.

Different from Embodiment I, the thin film transistor sensor provided by the present embodiment achieves the mutual insulation when the thin film transistor sensor 12 is in the non-work state not in the manner of disposing the spacer around the edge of the first gate electrode (the sensor can be turned on after a voltage is applied), instead, as shown in FIG. 7, a pressure conductive material 40 is disposed between the first substrate 10 and the second substrate 20, such that the first gate electrode 102 and the second gate electrode 202 are separated, and the pressure conductive material 40 conducts electricity when it is subjected to a pressure equal to or larger than a predetermined pressure. The predetermined pressure, for example, refers to a pressure to allow the pressure conductive material to be in a conductive state from an insulating state. The pressure conductive material is in the insulating state in a case of no pressure being applied, or the pressure subjected being not more than the predetermined pressure, such that the first gate electrode 102 and the second gate electrode 202 are insulated from each other, while in a case of being subjected to a pressure equal to, or lager than the predetermined pressure, the pressure conductive material is in a conductive state, such that the first gate electrode 102 and the second gate electrode 202 are electrically connected. For example, conductive rubber, conductive plastic, or the like can be adopted as the pressure conductive material 40. The conductive rubber achieves a better conductive effect by uniformly distributing conductive particles, such as glass-plated silver, aluminum-plated silver, or silver, into silicon rubber to allow the conductive particles contact each other through a pressure. Other details can refer to the description of embodiment I and is not repeated herein.

Embodiment III

The present embodiment provides a manufacturing method for a thin film transistor sensor. The method can comprise the following steps.

Forming a first gate electrode 102 on an inner side of a first flexible base substrate 101 to prepare a first substrate 10;

Forming a second gate electrode 202 on an inner side of a second flexible base substrate 201 to prepare a second substrate 20;

Forming an active layer 103 facing the first gate electrode 102, and a source electrode 104 and a drain electrode 105 electrically connected to the active layer 103 on the first flexible base substrate 101;

Disposing the first substrate 10 and the second substrate 20 in an opposite manner, such that the second gate electrode 202 and the first gate electrode 102 at least partially face each other, and are insulated from each other when the thin film transistor sensor is in a non-work state. For example, the first substrate 10 and the second substrate 20 are laminated by adopting a hot-press process. For example, the second gate electrode and the first gate electrode at least partially face each other, and are separated and configured to be electrically connected after the thin film transistor sensor is applied with a voltage, such that the thin film transistor sensor is turned on.

For example, the manufacturing method for a thin film transistor sensor provided by an example of the present embodiment further comprises: forming a spacer 30 disposed between the first substrate 10 and the second substrate 20, so as to separate the first gate electrode 102 from the second gate electrode 202. In this way, the thin film transistor sensor according to Embodiment I can be obtained.

For example, in the manufacturing method for a thin film transistor sensor provided by an example of the present embodiment, a source electrode 104, a drain electrode 105 and an active layer 103 are formed on the inner side of the first flexible base substrate 101, a flexible gate electrode insulating layer 106 is formed between the first gate electrode 102 and the source electrode 104, and the drain electrode 105 and the active layer 103. The flexible gate electrode insulating layer 106 and the spacer 30 are integrally formed.

For example, in the manufacturing method for a thin film transistor sensor provided by an example of the present embodiment, a first thickening layer 107 is formed on a side of the first gate electrode 102 facing the second gate electrode 202, and/or, a second thickening layer 203 is disposed on a side of the second gate electrode 202 facing the first gate electrode 102, and a thickness of the first thickening layer 107, a thickness of the second thickening layer 203, or a sum of the thickness of the first thickening layer 107 and that of the second thickening layer 203 is smaller than a distance between the first gate electrode 102 and the second gate electrode 202.

For example, in the manufacturing method for a thin film transistor sensor provided by an example of the present embodiment, the first thickening layer 107 and the first gate electrode 102 are integrally formed, and/or the second thickening layer 203 and the second gate electrode 202 are integrally formed.

For example, the manufacturing method for a thin film transistor sensor provided by an example of the present embodiment comprises the following steps.

Preparing a First Substrate 10.

The step of the preparing of the first substrate 10, for example, includes the following steps: forming the first gate electrode 102 on the inner side of a first flexible base substrate 101 by a patterning process; and forming an active layer 103 facing the first gate electrode 102, and a source electrode 104 and a drain electrode 105 electrically connected to the active layer 103 on the first flexible base substrate 101 by a patterning process.

Preparing a Second Substrate 20.

The step of the Preparing the second substrate 20, for example, includes the following step: forming the second gate electrode 202 on the inner side of a second flexible base substrate 201 by a patterning process.

Disposing the first substrate 10 and the second substrate 20 in an opposite manner, such that the second gate electrode 202 and the first gate electrode 102 at least partially face each other, and are insulated from each other when the thin film transistor sensor is in a non-work state. For example, the first substrate 10 and the second substrate 20 are laminated by a hot-press process.

For example, the manufacturing method for a thin film transistor sensor provided by an example of the present embodiment comprises the following steps.

Preparing a First Substrate.

The step of preparing the first substrate, for example, includes the following steps: forming a source electrode and a drain electrode of CNTs (a SWCNT solution with a high metallic content and larger concentration is used) on a PDMS elastic flexible substrate by a solution process; after the patterning of the source electrode and the drain electrode is finished, forming an active layer of CNTs (a SWCNTs material with a semi-conductive content higher than 99.9%) by a solution process; after patterning of the active layer of the CNTs is finished, a PMMA thin film is formed, and a gate electrode insulating layer and a spacer are integrally formed through exposure and developing processes with a mask. For example, when the gate electrode insulating layer and the spacer are integrally formed, the mask can adopt a multi-tone mask, which is adopted to expose the PMMA thin film, developing is carried out after the exposure process, then the integrated gate electrode insulating layer and spacer can be obtained. The multi-tone mask includes a grey tone mask, or a half-tone mask. For example, a proximity exposure machine can be used to finish the integral preparing of the gate electrode insulating layer and the spacer. After the gate electrode insulating layer and the spacer are formed, a thermal evaporation process is adopted with a mask to prepare a Pd electrode, and patterning is finished simultaneously to form the first gate electrode, which is not formed with a voltage applying lead. The solution process includes ink-jetting-printing, for example, but the present embodiments are not limited thereto.

Preparing a Second Substrate.

The step of preparing the second substrate for example includes the following steps: a Pd electrode is formed on a PDMS elastic flexible insulating layer by a thermal evaporation process, and a photolithography process is used to finish the patterning to form the second gate electrode, which is formed with a voltage applying lead.

The hot-press process is used to laminate the first substrate and the second substrate to form the thin film transistor sensor. For example, the laminating can be performed under a certain atmosphere, such as an air, nitrogen gas or inert gas atmosphere. In this way, the airtight space formed by the first substrate, the second substrate and the spacer is filled with the air, nitrogen gas, or inert gas, but the present embodiments are not limited thereto.

Figure 8A:
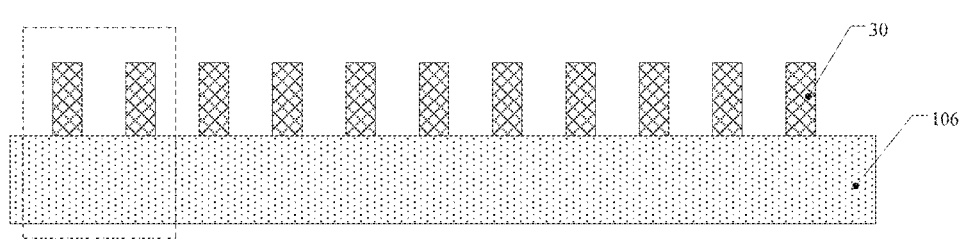
FIG. 8a is a sectional view of a flexible gate electrode insulating layer and a spacer in a thin film transistor sensor array provided by an embodiment of the present disclosure.
Figure 8B:
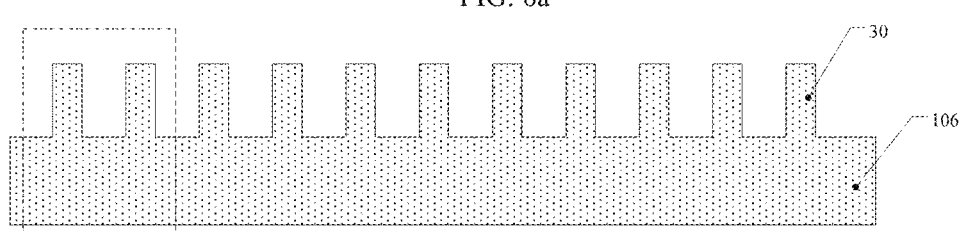
FIG. 8b is a sectional view of a flexible gate electrode insulating layer and a spacer, which are integrally formed, in a thin film transistor sensor array provided by an embodiment of the present disclosure.

The method in the embodiment of the present disclosure can be adopted to manufacture single thin film transistor sensor, and can also be used to manufacture a thin film transistor sensor array, but the embodiments of the present disclosure are not limited thereto. In an instance that a thin film transistor sensor array is formed, one thin film transistor sensor can be disposed in a range of 0.5*0.5 mm, but embodiments are not limited thereto. FIG. 8a shows a sectional view of a flexible gate electrode insulating layer and a spacer in the thin film transistor sensor array, and the virtual line part is the sectional view of the flexible gate electrode insulating layer and the spacer corresponding to one thin film transistor sensor. FIG. 8b shows the flexible gate electrode insulating layer and the spacer which are integrally formed.

It is noted that in the embodiments of the present disclosure, the manufacture of the thin film transistor sensor or the array thereof is not limited to the methods above, the patterning, or patterning process can only include a photolithography process, or a photolithography process and an etching step, or can include other processes for forming a predetermined pattern, such as printing, ink jetting, or the like. The photolithography process includes processes, such as film forming, exposure, and developing process, and patterns are formed by photoresist, a mask, an exposure machine, or the like. The corresponding patterning process(es) can be selected according to the structure formed in the embodiments of the present disclosure.

Respective components and disposing manners of the thin film transistor sensor in the present embodiments can refer to description of Embodiment I and are not repeated herein.

Embodiment IV

Different from Embodiment III, the manufacturing method for a thin film transistor sensor provided by the present embodiment achieves the mutual insulation when the thin film transistor sensor is in the non-work state not in the manner of disposing the spacer around the edge of the first gate electrode; instead, a pressure conductive material is formed between the first substrate 10 and the second substrate 20, such that the first gate electrode 102 and the second gate electrode 202 are separated, and the pressure conductive material conducts electricity when it is subjected to a pressure equal to or larger than a predetermined pressure. In this way, a thin film transistor sensor like that in Embodiment II can be obtained. The pressure conductive material can refer to the description of Embodiment II, which is not repeated again.

It is noted that in the embodiment of the present disclosure, the mutual insulation when the thin film transistor sensor 12 is in the non-work state (the sensor can be turned on after a voltage is applied) is explained by taking the manner of forming the spacer 30 or the pressure conductive material 40 as an example. The mutual insulation when the thin film transistor sensor 12 is in the non-work state can be realized by using other manners, and the embodiments of the present disclosure are not limited thereto.

Some points below need to be explained:

(1) Unless otherwise defined, the same signs in the embodiments of the present disclosure and the drawings thereof represent the same meaning.

(2) The drawings of the embodiments of the present disclosure may merely involve the structures related in the embodiments of the present disclosure, and other structures can refer to a routine design.

(3) For the purpose of clearness, in the drawings of the embodiments of the present disclosure, the thickness of layers or regions is enlarged. It is appreciated that when elements, such as layers, films, regions, or substrates, are described to be located "on" or "under" another element, such element can be directly located "on" or "below" another element, or an intermediate element exists.

(4) If no conflicting is present, different embodiments and different features in the same one embodiment of the present disclosure can be combined with one another.

The described above are only exemplary embodiments of the present disclosure, and the present disclosure is not intended to be limited thereto. For one of ordinary skill in the art, various changes and alternations may be made without departing from the technical scope of the present disclosure, and all of these changes and alternations shall fall within the scope of the present disclosure.

The present application claims priority to the Chinese Patent Application No. 201610079996.9 filed on Feb. 4, 2016, the disclosure of which is incorporated herein by reference in its entirety as part of the present application.

What is claimed is:

1. A thin film transistor sensor, comprising a first substrate and a second substrate opposite to each other, wherein
   the first substrate comprises a first flexible base substrate and a first gate electrode on the first flexible base substrate;
   the second substrate comprises a second flexible base substrate and a second gate electrode on the second flexible base substrate;
   the first flexible base substrate further comprises an active layer, a source electrode, and a drain electrode; and
   the second gate electrode and the first gate electrode at least partially overlap and are separated from each other, and configured to be electrically connected after the thin film transistor sensor is applied with a pressure, to allow the thin film transistor sensor to be turned on.

2. The thin film transistor sensor according to claim 1, further comprising a spacer disposed between the first substrate and the second substrate, to separate the first gate electrode from the second gate electrode.

3. The thin film transistor sensor according to claim 2, wherein the spacer is disposed around an edge of the first gate electrode.

4. The thin film transistor sensor according to claim 3, wherein when the thin film transistor sensor is not applied with the pressure, the first substrate, the second substrate, and the spacer form an airtight space, and air, nitrogen gas, or inert gas exists in the airtight space.

5. The thin film transistor sensor according to claim 3, wherein the spacer comprises a plurality of dispersed sub-spacers.

6. The thin film transistor sensor according to claim 2, further comprising a thickening layer configured to improve sensitivity of the thin film transistor sensor to the pressure, wherein the thickening layer is disposed on at least one of the first gate electrode and the second gate electrode, and when the thin film transistor sensor is not applied with the pressure, a distance between the first gate electrode and the second gate electrode is larger than a thickness of the thickening layer.

7. The thin film transistor sensor according to claim 6, wherein the thickening layer and the first gate electrode, or the second gate electrode are integrally formed.

8. The thin film transistor sensor according to claim 1, wherein a material of the first gate electrode and the second gate electrode comprises carbon black.

9. The thin film transistor sensor according to claim 2, wherein a side of the first flexible base substrate provided with the first gate electrode is provided with the source electrode, the drain electrode, and the active layer; a flexible gate electrode insulating layer is disposed between the first gate electrode and the source electrode, the drain electrode, and the active layer; and the flexible gate electrode insulating layer and the spacer are integrally formed.

10. The thin film transistor sensor according to claim 9, wherein a material of the spacer comprises polymethyl methacrylate (PMMA), polyimide (PI), or polydimethylsiloxane (PDMS).

11. The thin film transistor sensor according to claim 1, further comprising a pressure conductive material disposed between the first substrate and the second substrate to separate the first gate electrode from the second gate electrode, the pressure conductive material conducting electricity when it is subjected to a pressure equal to or larger than a predetermined pressure.

12. The thin film transistor sensor according to claim 11, wherein a material of the active layer comprises semi-conductive carbon nanotubes, or an organic semiconductor material.

13. The thin film transistor sensor according to claim 11, wherein a material of the source electrode and the drain electrode comprises metallic carbon nanotubes, or metal.

14. The thin film transistor sensor according to claim 11, wherein a material of the first flexible base substrate and/or the second flexible base substrate is polymethyl methacrylate (PMMA), polyimide (PI), polyethylene naphtalate, poly-p-xylylene, or polydimethylsiloxane (PDMS).

15. A manufacturing method for a thin film transistor sensor, comprising:
   forming a first gate electrode on a first flexible base substrate to prepare a first substrate;
   forming a second gate electrode on a second flexible base substrate to prepare a second substrate;
   forming an active layer, a source electrode, and a drain electrode on the first flexible base substrate; and
   disposing the first substrate and the second substrate to face each other, to allow the second gate electrode and the first gate electrode to at least partially overlap and to be separated, and configured to be electrically connected to each other after the thin film transistor sensor is applied with a pressure, so as to allow the thin film transistor sensor to be turned on.

16. The manufacturing method for a thin film transistor sensor according to claim 15, further comprising: forming a spacer disposed between the first substrate and the second substrate to separate the first gate electrode from the second gate electrode.

17. The manufacturing method for a thin film transistor sensor according to claim 15, further comprising: forming a pressure conductive material disposed between the first substrate and the second substrate to separate the first gate electrode from the second gate electrode, the pressure conductive material conducting electricity when it is subjected to a pressure equal to or larger than a predetermined pressure.

18. The manufacturing method for a thin film transistor sensor according to claim 16, further comprising: forming the source electrode, the drain electrode, and the active layer on a side of the first flexible base substrate provided with the first gate electrode; and forming a flexible gate electrode insulating layer between the first gate electrode and the source electrode, and the drain electrode and the active layer, the flexible gate electrode insulating layer and the spacer being integrally formed.

19. The manufacturing method for a thin film transistor sensor according to claim 18, further comprising forming a thickening layer to improve sensitivity of the thin film transistor sensor to the pressure, wherein the thickening layer is formed on at least one of the first gate electrode and the second gate electrode, and when the thin film transistor sensor is not applied with the pressure, a distance between the first gate electrode and the second gate electrode is larger than a thickness of the thickening layer.

20. The manufacturing method for a thin film transistor sensor according to claim 19, wherein the thickening layer and the first gate electrode, or second gate electrode are integrally formed.

* * * * *